United States Patent
Takeyama et al.

[11] Patent Number: 6,156,476
[45] Date of Patent: Dec. 5, 2000

[54] POSITIVE PHOTORESIST COMPOSITION

[75] Inventors: Naoki Takeyama, Settsu; Hiromi Ueki, Osaka; Yuji Ueda, Izumi; Takehiro Kusumoto, Takarazuka; Yuko Nakano, Ibaraki, all of Japan

[73] Assignee: Sumitomo Chemical Company, Limited, Osaka, Japan

[21] Appl. No.: 08/179,196

[22] Filed: Jan. 10, 1994

[30] Foreign Application Priority Data

Jan. 18, 1993 [JP] Japan .................................. 5-005795

[51] Int. Cl.$^7$ ..................................................... G03C 1/492
[52] U.S. Cl. ...................... 430/270.1; 430/326; 430/905; 430/910
[58] Field of Search ..................................... 430/270, 326, 430/905, 910, 270.1

[56] References Cited

U.S. PATENT DOCUMENTS

| | | | |
|---|---|---|---|
| 4,491,628 | 1/1985 | Ito et al. | 430/270.1 |
| 4,678,737 | 7/1987 | Schneller et al. | 430/270.1 |
| 4,904,563 | 2/1990 | Aoai et al. | 430/270.1 |
| 5,286,602 | 2/1994 | Pawlowski et al. | 430/270.1 |
| 5,332,650 | 7/1994 | Murata et al. | 430/270.1 |
| 5,350,660 | 9/1994 | Urano et al. | 430/270.1 |
| 5,362,600 | 11/1994 | Sinta et al. | 430/905 |
| 5,397,679 | 3/1995 | Ueda et al. | 430/270.1 |

FOREIGN PATENT DOCUMENTS

| | | | |
|---|---|---|---|
| 0366590 | 5/1990 | European Pat. Off. | |
| 0388343 | 9/1990 | European Pat. Off. | |
| 0388813 | 9/1990 | European Pat. Off. | 430/270.1 |
| 0 440 374 | 8/1991 | European Pat. Off. | |
| 0 520 265 | 12/1992 | European Pat. Off. | |
| 0541112 | 5/1993 | European Pat. Off. | 430/270.1 |
| 0 564 997 | 10/1993 | European Pat. Off. | |
| 0 569 7047 | 11/1993 | European Pat. Off. | |
| 3-223862 | 10/1991 | Japan . | |
| 5-197154 | 8/1993 | Japan . | |

OTHER PUBLICATIONS

Partial Translation of Japanese Patent Application No. 5–197154 (Pub Aug. 1993).

C.A. Spence et al., Silylation of poly (t–BOC) Syrene Resists Advances in Resist Technology and Processing VII, vol. 1262, pp. 344–357 (1990).

Database Inspec Institute of Electrical Engineers, Stevenage, GB Inspec No. 4369457, Abstract of Kawai et al. 5th (4th International) Microprocess Conference (MPC 92), Kawasaki Japan, Jul. 13–16 1992.

*Primary Examiner*—Janis L. Dote
*Attorney, Agent, or Firm*—Birch, Stewart, Kolasch & Birch LLP

[57] ABSTRACT

The present invention provides a positive photoresist composition comprising an alkali-soluble resin containing a copolymer of p-vinylphenol or a derivative thereof and styrene, a dissolution inhibitor and a photo-induced acid precursor. This positive photoresist composition exhibits excellent sensitivity and resolution while maintaining excellence in other properties such as heat resistance, film thickness retention, adhesion and profile, in far ultraviolet ray lithography.

29 Claims, No Drawings

POSITIVE PHOTORESIST COMPOSITION

BACKGROUND OF THE INVENTION

1. Field of the Invention

The present invention relates to a positive photoresist composition suitable for use in lithographies using far ultraviolet rays (including excimer lasers and the like), etc.

2. Related Art

Recently, with a rise in the integration level of integrated circuits, formation of pattern of sub-micron order is required. Particularly, excimer laser lithography is watched with interest because it enables production of 64 and 256 megabit Dynamic Random Access Memories (MDRAMS). As a result of such an alteration of light source from the prior mercury lamp rays such as g ray and i ray to the laser having a wavelength of, for example, 248 nm, the following properties are demanded of today's resists in addition to the hitherto required properties such as heat resistance, film thickness retention, profile, etc.:

(1) a high sensitivity to the short wavelength light sources mentioned above, and (2) a high resolution.

In view of the above-mentioned state of art, the so-called chemical amplification type resist utilizing an acid catalyst and a chemical amplification effect has been proposed. In this type of resist, an acid is generated from a photo-induced acid precursor upon irradiation with a light, and a reaction takes place due to the catalytic action of the acid and thereby a difference arises between the solubilities of the exposed part and unexposed part in developing solution. As a result, a positive (or negative) photoresist is obtained.

As the alkali-soluble resin in such chemical amplification type resists, poly-(p-hydroxystyrene-p-t-butoxycarbonyloxystyrene) has hitherto been used as mentioned in, for example, Japanese Patent Application KOKAI No. 2-209977. However, this type of resin cannot satisfy the conditions necessary for production of 64 and 256 MDRAM for the following reasons:

(1) such a resin is low in adhesive strength to the silicone substrate, and therefore the positive pattern formed upon development is readily fissile;

(2) in such a resin, a large quantity of carbonium ion is formed at the time when the t-butoxycarbonyl group is eliminated by the action of the acid generated upon irradiation with light, which promotes an inversion from positive type to negative type; and (3) such a resin cannot give a positive pattern of high resolution.

SUMMARY OF THE INVENTION

It is an object of the present invention to provide a positive photoresist composition exhibiting excellent sensitivity and resolution while maintaining excellence in other properties such as heat resistance, film thickness retention, profile, etc.

According to the present invention, there is provided a positive photoresist composition comprising an alkali-soluble resin containing a copolymer of p-vinylphenol or a derivative thereof and styrene, a dissolution inhibitor and a photo-induced acid precursor.

DESCRIPTION OF THE INVENTION

Generally speaking, the copolymer of p-vinylphenol or a derivative thereof and styrene preferably has a weight average molecular weight of from 1,000 to 6,000, and more preferably from 2,000 to 5,000. The p-vinylphenol/styrene copolymer used in the invention can easily be produced by a radical or ionic polymerization of a mixture of 4-acetoxystyrene and styrene, followed by hydrolysis of the resulting co-polymer under alkaline condition. In the copolymer formed by the hydrolysis, the molar ratio of p-vinylphenol to styrene is preferably from 50:50 to 95:5, and more preferably from 65:35 to 85:15. The p-vinylphenol/styrene copolymer preferably has a weight average molecular weight of from 1,000 to 5,000 and more preferably from 2,000 to 4,000.

As said derivative of p-vinylphenol, a partially p-t-butoxycarbonyloxylated styrene prepared by replacing a part of the hydroxyl group of p-vinylphenol with a t-butoxycarbonyloxy group is preferred. A copolymer of the partially butoxycarbonyloxylated styrene and styrene can be produced by, for example, reacting the above-mentioned p-vinylphenol/styrene copolymer with di-t-butyl dicarbonate in a hydrophilic organic solvent such as acetone or tetrahydrofuran in the presence of an alkali such as potassium carbonate. Preferably, this reaction is carried out in the presence of a phase transfer catalyst such as crown ether.

As preferable examples of the copolymer of p-vinylphenol or a derivative thereof and styrene, those containing a group represented by the following formula (Ia) or (Ib):

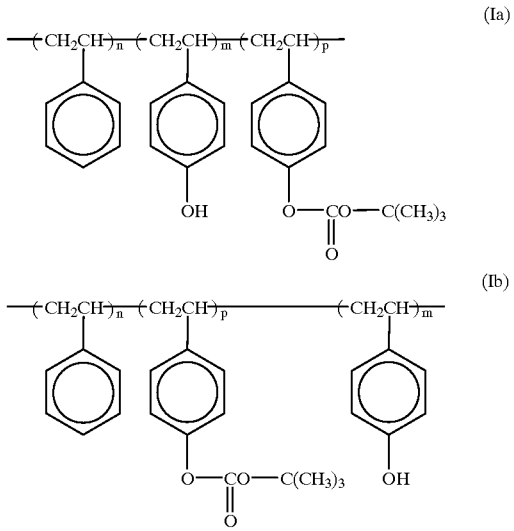

wherein m, n and p are numbers satisfying (m+p):n=from 50:50 to 95:5 and p:(m+p)=from 1:50 to 45:50, can be referred to. Among these preferable copolymers, further preferable are the copolymers of the above-mentioned formulas in which m, n and p satisfy (m+p):n=from 65:35 to 85:15 and p:(m+p) =from 1:20 to 30:50.

Examples of the photo-induced acid precursor include the esters represented by the following formula (III):

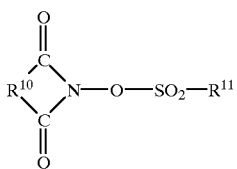

(III)

wherein $R^{10}$ represents an optionally substituted arylene, alkylene or alkenylene group and $R^{11}$ represents an optionally substituted alkyl or aryl group; the disulfone compounds represented by the following formula (IV):

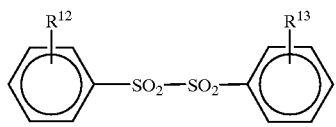

(IV)

wherein $R^{12}$ and $R^{13}$ independently of one another each represents a hydrogen atom, an alkyl group or an alkoxyl group; the esters represented by the following formula (V):

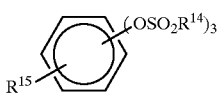

(V)

wherein $R^{14}$ represents an optionally substituted alkyl or aryl group and $R^{15}$ represents a hydrogen atom, an alkyl group, an alkoxyl group or an alkylcarbonyloxy group; and the like.

In the formula (III), examples of the arylene group represented by $R^{10}$ include monocyclic and bicyclic arylene groups, among which preferable are phenylene, naphthylene and the like. As the preferable substituent present on the arylene group, a halogen atom, a nitro group, an acetylamino group and the like can be referred to.

Examples of the alkylene group represented by $R^{10}$ include straight chain and branched chain alkylene groups, among which those having 1 to 6 carbon atoms are preferred and ethylene, propylene and the like are particularly preferred. As the preferable substituent present on the alkylene group, a halogen atom, lower alkoxy group, monocyclic aryl group and the like can be referred to.

Examples of the alkenylene group represented by $R^{10}$ include those having 2 to 4 carbon atoms, among which vinylidene and the like are preferred. As the preferable substituent present on the alkenylene group, monocyclic aryl groups and the like can be referred to.

Examples of the alkyl group represented by $R^{11}$ include straight chain, branched chain and cyclic alkyl groups, among which straight chain alkyl groups having 1 to 8 carbon atoms are preferred. As the preferable substituent present on the alkyl group, a halogen atom, lower alkoxy group and the like can be referred to.

Examples of the aryl group represented by $R^{11}$ include monocyclic and bicyclic aryl groups, among which monocyclic aryl groups are preferred, and phenyl groups and the like are particularly preferred. As the preferable substituent present on the aryl group, a lower alkyl group, lower alkoxy group, halogen atom and the like can be referred to.

As preferable examples of the ester represented by the formula (III), the following can be referred to:

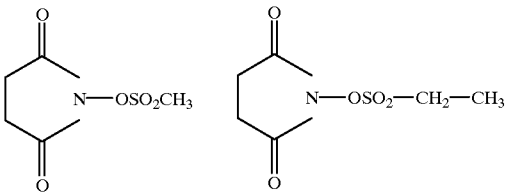

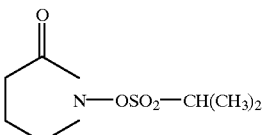

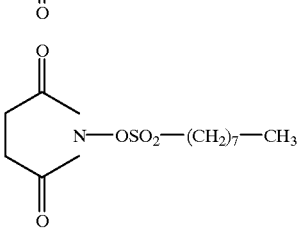

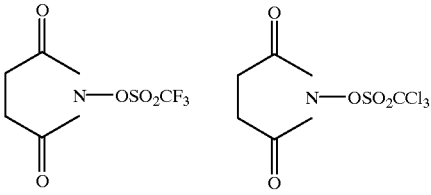

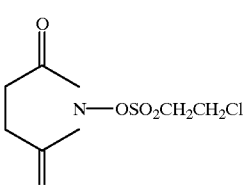

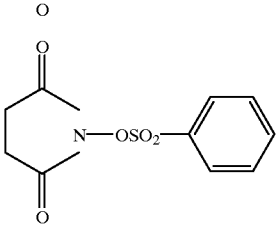

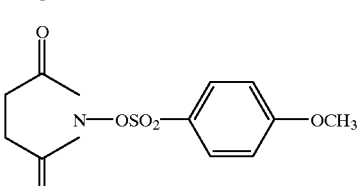

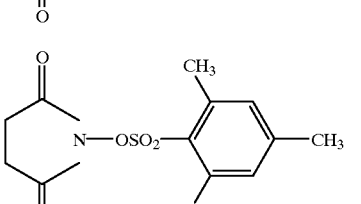

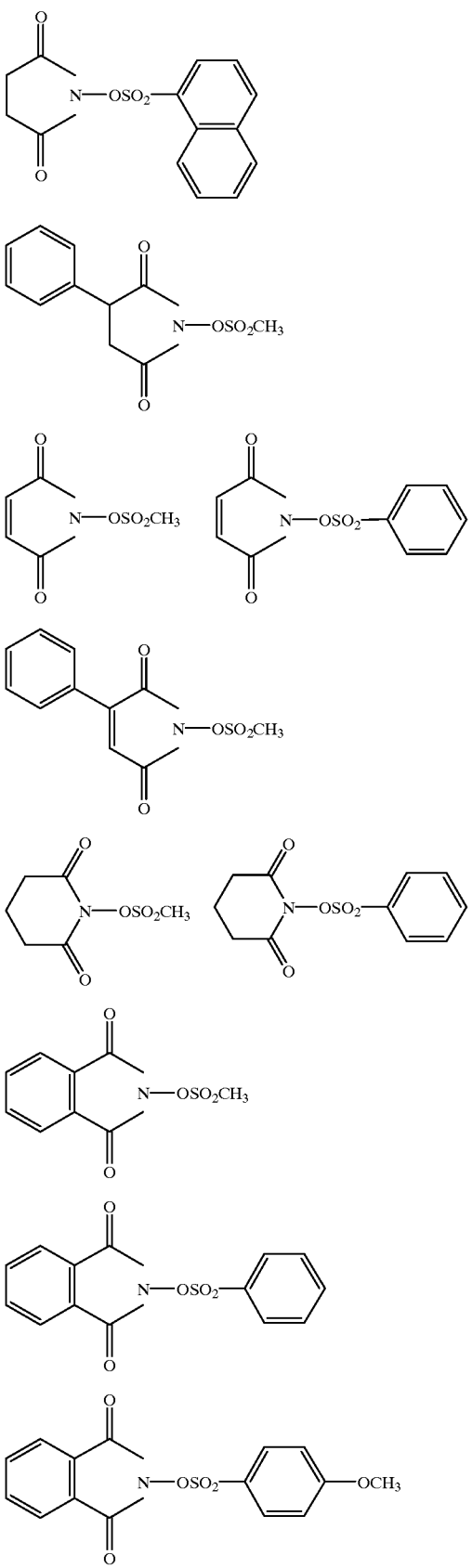

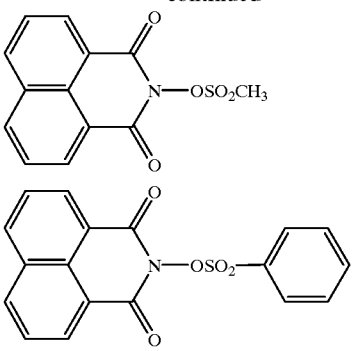

and the like.

The esters represented by the above-presented formula (III) can be produced by reacting a cyclic N-hydroxyimide compound represented by the following formula (IIIa):

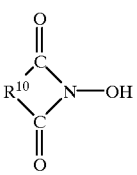

(IIIa)

wherein $R^{10}$ is as defined above, which can be produced according to the method mentioned in, for example, G. F. Jaubert, Ber., 28, 360 (1985), D. E. Ames et al., J. Chem. Soc., 3518 (1955) or M. A. Stolberg et al., J. Amer. Chem. Soc., 79, 2615 (1957), with a sulfonyl chloride compound represented by the formula $R^{11}$—$SO_2Cl$ wherein $R^{11}$ is as defined above, under basic conditions [L. Bauer et al., J. Org. Chem., 24, 1293 (1959)].

The ester represented by the formula (III) may be used either independently or in the form of a mixture of two or more compounds.

The disulfone compound represented by the formula (IV) can be produced according to the method mentioned in, for example, Japanese Patent Application KOKAI No. 1-284554, J. Org. Chem., 31, 3418 (1966), J. Chem. Soc., 93, 1524 (1908), Ber., 49, 2593 (1916), etc., namely according to a method which comprises producing a disulfone compound from sulfinic acid by the use of cobalt (III) sulfate in aqueous sulfuric acid, a method which comprises producing a disulfone compound from sulfonyl chloride by the use of ethyl xanthogenate, a method which comprises producing a disulfone compound by reacting sulfinic acid and sulfonyl chloride under a basic condition, etc.

As preferable examples of the disulfone compound represented by the formula (IV), the following can be referred to:

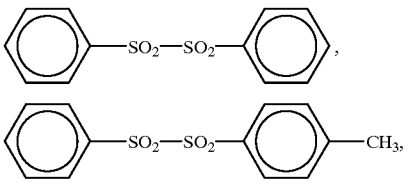

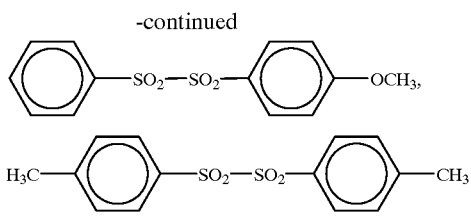

and the like.

The ester represented by the formula (V) can be produced, for example, according to the method mentioned in Japanese Patent Application KOKAI No. 2-245756, namely by reacting a corresponding phenol compound with sulfonyl chloride under a basic condition.

As preferable examples of the ester represented by the formula (V), the following can be referred to:

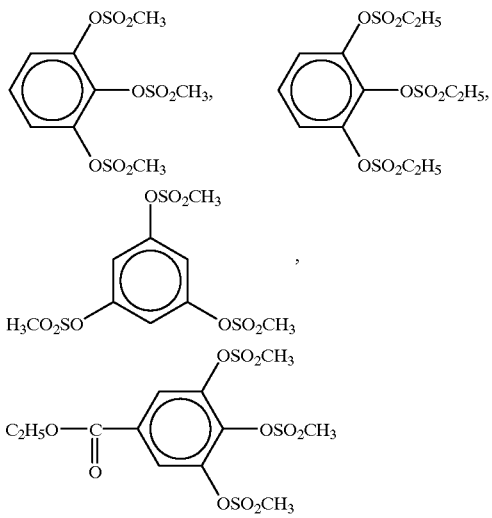

and the like.

Examples of the dissolution inhibitor include the compounds having a benzene ring substituted with t-butoxycarbonyloxy group mentioned in European Patent Application No. 0564997A2; the compounds represented by the following formula (II):

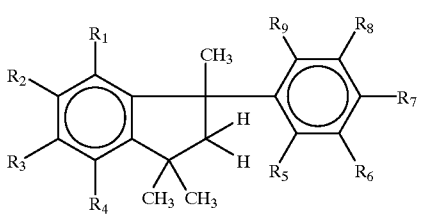

wherein $R_1$ to $R_9$ each represents hydrogen atom, alkyl group, t-butoxycarbonyloxy group or hydroxyl group, provided that at least one of $R_1$ to $R_4$ is a t-butoxy-carbonyloxy group and at least one of $R_5$ to $R_9$ is t-butoxycarbonyloxy group; and the like.

Of these dissolution inhibitors, preferable are, for example, the following ones:

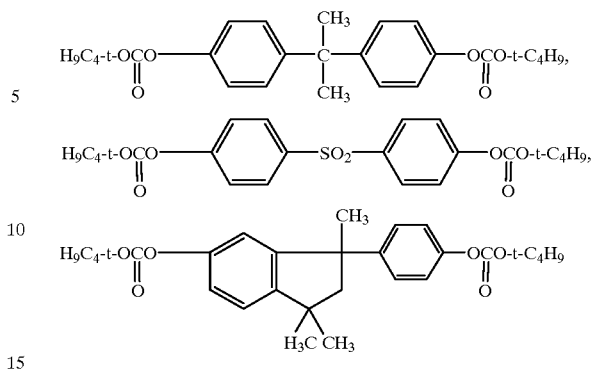

and the like.

These dissolution inhibitors are used either independently or in the form of a mixture of two or more compounds.

In the positive photoresist compositions, the mixing ratio of the ingredients is usually as follows: alkali-soluble resin from 30 to 90% by weight, dissolution inhibitor from 2 to 50% by weight, photo-induced acid precursor from 0.1 to 20% by weight; and preferably as follows: alkali-soluble resin from 50 to 85%, dissolution inhibitor from 12 to 40% by weight, photo-induced acid precursor from 1 to 15% by weight. To the positive photoresist composition of the present invention, various additives conventionally used in this field of the art, such as sensitizer, dye, adhesion improver and the like, may be added, if desired.

A photoresist solution is usually prepared by mixing the above-mentioned positive photoresist composition into a solvent so that the concentration of the composition in the total mixture comes to 1 to 50% by weight. The solvents usable for this purpose include, for example, ethyl cellosolve acetate, methyl cellosolve acetate, ethyl cellosolve, methyl cellosolve, propylene glycol monomethyl ether acetate, propylene glycol monoethyl ether acetate, propylene glycol monomethyl ether, propylene glycol monoethyl ether, diethylene glycol dimethyl ether, ethyl lactate, butyl acetate, ethyl pyruvate, 2-heptanone, cyclohexanone, methyl isobutyl ketone, xylene and the like. These solvents are used either independently or in combination of two or more members.

Next, the invention will be explained more concretely with reference to the following examples. The invention is by no means limited by these examples. In the examples, parts are by weight, unless otherwise referred to.

REFERENTIAL EXAMPLE 1

In 45 g of 5% aqueous solution of sodium carbonate was dissolved 3.5 g of N-hydroxysuccinimide. To the resulting solution was dropwise added 6.0 g of benzenesulfonyl chloride at room temperature. After the dropping the reaction mixture was stirred at room temperature for 2 hours. Then, the reaction mixture was poured into 300 ml of water and the deposited crystalline product was collected by filtration. The crystalline product was washed with water until the washings had reached neutrality, and then recrystallized from acetone/water mixture to obtain succinimide benzenesulfonate.

REFERENTIAL EXAMPLE 2

Into a mixture of 11.5 g of MARUKA LYNCUR CST-70 (the molar ratio of p-hydroxystyrene to styrene in copolymer is 7:3; weight average molecular weight 2,900; manufactured by Maruzen Petrochemical Co.) and 100 g of tetrahydrofuran were added 1.53 g of di-t-butyl dicarbonate (manufactured by Wako Pure Chemicals Co.), 1.16 g of potassium carbonate and 0.05 g of 18-Crown-6 (crown ether, manufactured by Wako Pure Chemical Industries Ltd.). After the addition, the resulting mixture was reacted at room temperature for 24 hours. The reaction mixture was filtered, and the filtrate was concentrated. After the concentration, 200 g of ethyl acetate was added to the residue. The ethyl acetate solution thus obtained was five times washed with 200 ml portion of distilled water. After concentrating the washed solution, 200 ml of diglyme was added to the residue. The diglyme (diethylene glycol dimethyl ether) solution thus obtained was concentrated to remove the small quantities of remaining water and ethyl acetate. Thus, a solution of resin A in diglyme (the concentration of solid component is 33% by weight) was obtained. In the resin A thus obtained, 10% of the total hydroxyl group in the starting resin (MARUKA LYNCUR CST-70) was protected by a t-butoxy-carbonyloxy group.

REFERENTIAL EXAMPLE 3

Into a mixture of 11.5 g of MARUKA LYNCUR CST-70 and 100 g of tetrahydrofuran were added 3.06 g of di-t-butyl dicarbonate, 2.32 g of potassium carbonate and 0.05 g of 18-Crown-6. After the addition, the resulting mixture was reacted at room temperature for 24 hours. The reaction mixture was filtered, and the filtrate was concentrated. After the concentration, 200 g of ethyl acetate was added to the residue. The ethyl acetate solution thus obtained was five times washed with 200 ml portions of distilled water. After concentrating the washed solution, 200 ml of diglyme was added to the residue. The diglyme solution thus obtained was concentrated to remove the small quantities of remaining water and ethyl acetate. Thus, a solution of resin B in diglyme (the concentration of solid component is 33% by weight) was obtained. In the resin B thus obtained, 20% of the total hydroxyl group in the starting resin was protected by at-butoxy-carbonyloxy group.

EXAMPLE 1

In 50 parts of diglyme were dissolved 13.5 parts of resin A, 4.1 parts of a dissolution inhibitor represented by the following formula:

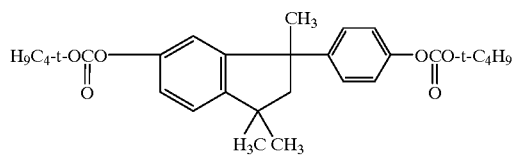

and 2.0 parts of succinimide benzenesulfonate (photo-induced acid precursor) obtained in Referential Example 1. The solution was filtered through a Teflon filter having a pore size of 0.2 pm to prepare a resist solution.

A silicon wafer washed in the conventional manner was coated with the resist solution by means of a spinner so as to give a coating thickness of 0.7 $\mu$m. Then, the silicon wafer was pre-baked on a hot plate at 100° C. for one minute. Then, the pre-baked coating film was exposed to light through a patterned reticle with KrF Excimer Laser Stepper (NSR-1755, EX8A, NA=0.45, manufactured by Nicon Co.) having an exposure wavelength of 248 nm. After the exposure, the wafer was heated on a hot plate at 80° C. for 90 seconds, and developed with a 2.38% aqueous solution of tetramethylammonium hydroxide to obtain a positive pattern. No peeling of pattern was observed. Observation of the pattern thus formed by means of an electron microscope revealed that a 0.30 $\mu$m line-and-space pattern could be resolved with a good profile and the sensitivity was 70 mJ/cm$^2$.

EXAMPLE 2

A positive pattern was formed by repeating Example 1, except that the resin A was replaced with resin B.

No peeling of pattern was observed. Observation of the pattern thus formed by means of an electron microscope revealed that a 0.30 $\mu$m line-and-space pattern could be resolved with a good profile and the sensitivity was 94 mJ/cm$^2$.

EXAMPLE 3

A positive pattern was formed by repeating Example 2, except that the succinimide benzenesulfonate was replaced with 1.5 parts of N-hydroxysuccinimide 2-propanesulfonate.

No peeling of pattern was observed. Observation of the pattern thus formed by means of an electron microscope revealed that a 0.30 $\mu$m line-and-space pattern could be resolved with a good profile and the sensitivity was 70 mJ/cm$^2$.

EXAMPLE 4

A positive pattern was formed by repeating Example 3, except that the succinimide 2-propanesulfonate was replaced with N-hydroxysuccinimide chloromethane-sulfonate.

No peeling of pattern was observed. Observation of the pattern thus formed by means of an electron microscope revealed that a 0.40 $\mu$m line-and-space pattern could be resolved with a good profile and the sensitivity was 15 mJ/cm$^2$.

EXAMPLE 5

A positive pattern was formed by repeating Example 3, except that the succinimide 2-propanesulfonate was replaced with diphenyl disulfone.

No peeling of pattern was observed. Observation of the pattern thus formed by means of an electron microscope revealed that a 0.50 $\mu$m line-and-space pattern could be resolved with a good profile and the sensitivity was 60 mJ/cm$^2$.

EXAMPLE 6

A positive pattern was formed by repeating Example 3, except that the succinimide 2-propanesulfonate was replaced with pyrogallol tri-methanesulfonate. No peeling of pattern was observed. Observation of the pattern thus formed by means of an electron microscope revealed that a 0.45 $\mu$m line-and-space pattern could be resolved with a good profile and the sensitivity was 178 mJ/cm$^2$.

EXAMPLE 7

A positive pattern was formed by repeating Example 3, except that the succinimide 2-propanesulfonate was replaced with phloroglucin tri-methanesulfonate. No peeling of pattern was observed. Observation of the pattern thus formed by means of an electron microscope revealed that a 0.50 $\mu$m line-and-space pattern could be resolved with a good profile and the sensitivity was 200 mJ/cm$^2$.

EXAMPLE 8

A positive pattern was formed by repeating Example 3, except that the succinimide 2-propanesulfonate was replaced with tri-methanesulfonic acid ester of ethyl gallate. No peeling of pattern was observed. Observation of the pattern thus formed by means of an electron microscope revealed that a 0.50 μm line-and-space pattern could be resolved with a good profile and the sensitivity was 240 mJ/cm².

EXAMPLE 9

A positive pattern was formed by repeating Example 1, except that the resin A was replaced with MARUKA LYN-CUR CST-70 (a copolymer of p-vinyl phenol and styrene having a copolymerization ratio PVP/ST of 70/30 manufactured by Maruzen Peterochemical Co.; weight average molecular weight 2,300). No peeling of pattern was observed. Observation of the pattern thus formed by means of an electron microscope revealed that a 0.50 μm line-and-space pattern could be resolved with a good profile and the sensitivity was 85 mJ/cm².

What is claimed is:

1. A positive photoresist composition comprising an alkali-soluble resin containing a copolymer of p-vinyphenol, p-t-butoxycarbonyloxystyrene and styrene; a dissolution inhibitor; and a photo-induced acid precursor, wherein the number of p-vinylphenol (m) the number of p-t-butoxycarbonyloxvstyrene (p), and the number of styrene (n) satisfy the following conditions:

(m+p):n=from 50:50 to 95:5 and p:(m+p)=from 1:50 to 45:50; and wherein said dissolution inhibitor is a compound represented by the following formula (II):

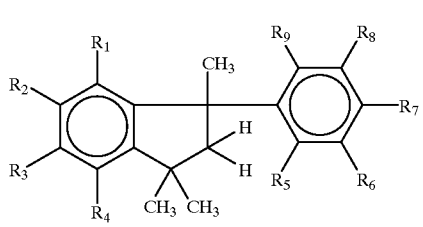

(II)

wherein R₁ to R₉ each represents a member selected from the group consisting of a hydrogen atom, an alkyl group, a t-butoxycarbonyloxy group and a hydroxyl group, provided that at least one of R₁ to R₄ is a t-butoxycarbonyloxy group and at least one of R₅ to R₉ is a t-butoxycarbonyloxy group.

2. The positive photoresist composition according to claim 1, wherein said photo-induced acid precursor is an ester represented by the following formula (III):

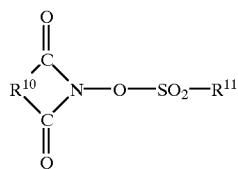

(III)

wherein R¹⁰ represents an optionally substituted arylene, alkylene or alkenylene group and R¹¹ represents an optionally substituted alkyl or aryl group.

3. The positive photoresist composition according to claim 2, wherein said optionally substituted arylene group R¹⁰ is selected from the group consisting of a monocyclic arylene group and a bicyclic arylene group, and said optionally substituted alkylene group R¹⁰ is selected from the group consisting of a straight chain alkylene group and a branched chain alkylene group.

4. The positive photoresist composition according to claim 3, wherein said straight chain alkylene group and said branched chain alkylene group each has 1 to 6 carbon atoms.

5. The positive photoresist composition according to claim 4, wherein said straight chain alkylene group is selected from the group consisting of ethylene and propylene.

6. The positive photoresist composition according to claim 2, wherein said optionally substituted arylene group R¹⁰ is selected from the group consisting of a phenylene group and a naphthylene group.

7. The positive photoresist composition according to claim 2, wherein R¹⁰ is an arylene group which is substituted with a member selected from the group consisting of a halogen atom, a nitro group, and an acetylamino group.

8. The positive photoresist composition according to claim 2, wherein R¹⁰ is an alkylene group which is substituted with a member selected from the group consisting of a halogen atom, a lower alkoxy group, and a monocyclic aryl group.

9. The positive photoresist composition according to claim 2, wherein said optionally substituted alkenylene group R¹⁰ has 2 to 4 carbon atoms.

10. The positive photoresist composition according to claim 9, wherein said optionally substituted alkenylene group R¹⁰ having 2 to 4 carbon atoms is a vinylidene group.

11. The positive photoresist composition according to claim 9, wherein R¹⁰ is an alkenylene group which is substituted with a monocyclic aryl group.

12. The positive photoresist composition according to claim 2, wherein said optionally substituted alkyl group R¹¹ is selected from the group consisting of a straight chain alkyl group, a branched chain alkyl group, and a cyclic alkyl group.

13. The positive photoresist composition according to claim 12, wherein said straight chain alkyl group has 1 to 8 carbon atoms.

14. The positive photoresist composition according to claim 12, wherein R¹¹ is an alkyl group which is substituted with a member selected from the group consisting of a halogen atom and a lower alkoxy group.

15. The positive photoresist composition according to claim 2, wherein said optionally substituted aryl group R¹¹ is selected from the group consisting of a monocyclic aryl group and a bicyclic aryl group.

16. The positive photoresist composition according to claim 15, wherein said monocyclic aryl group is a phenyl group.

17. The positive photoresist composition according to claim 15, wherein R¹¹ is an aryl group which is substituted with a member selected from the group consisting of a lower alkyl group, a lower alkoxy group, and a halogen atom.

18. The positive photoresist composition according to claim 15, wherein R¹¹ is an aryl group which is substituted with a member selected from the group consisting of a methyl group, methoxy group, and a halogen atom.

19. The positive photoresist composition according to claim 2, wherein said ester represented by formula (III) is at least one member selected from the group consisting of

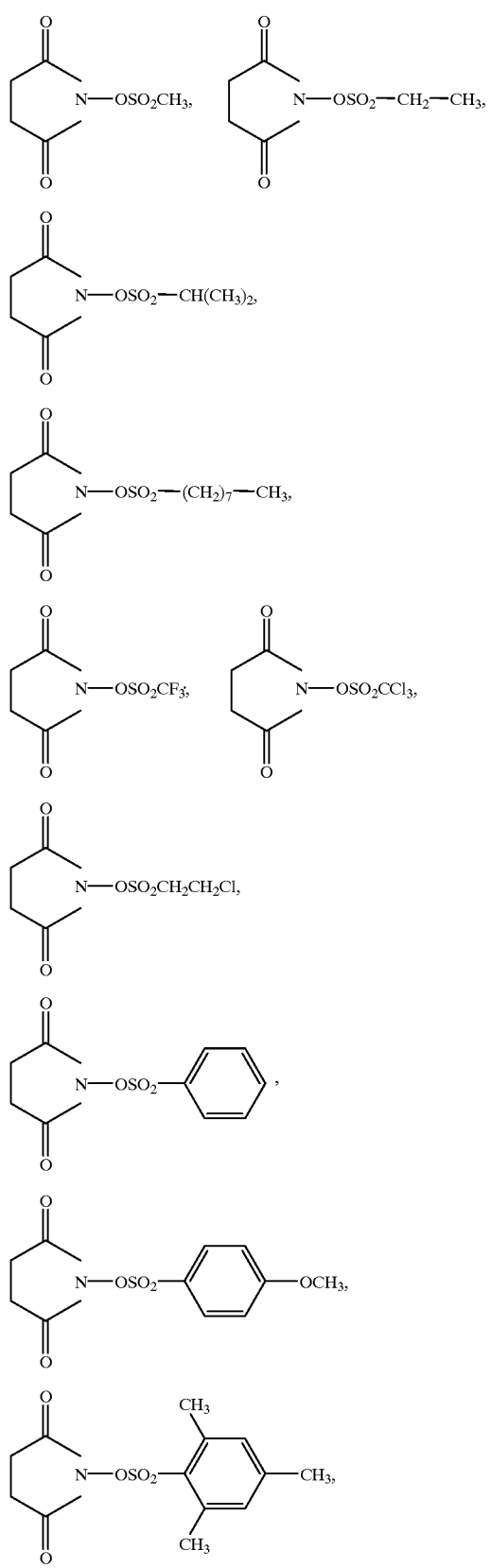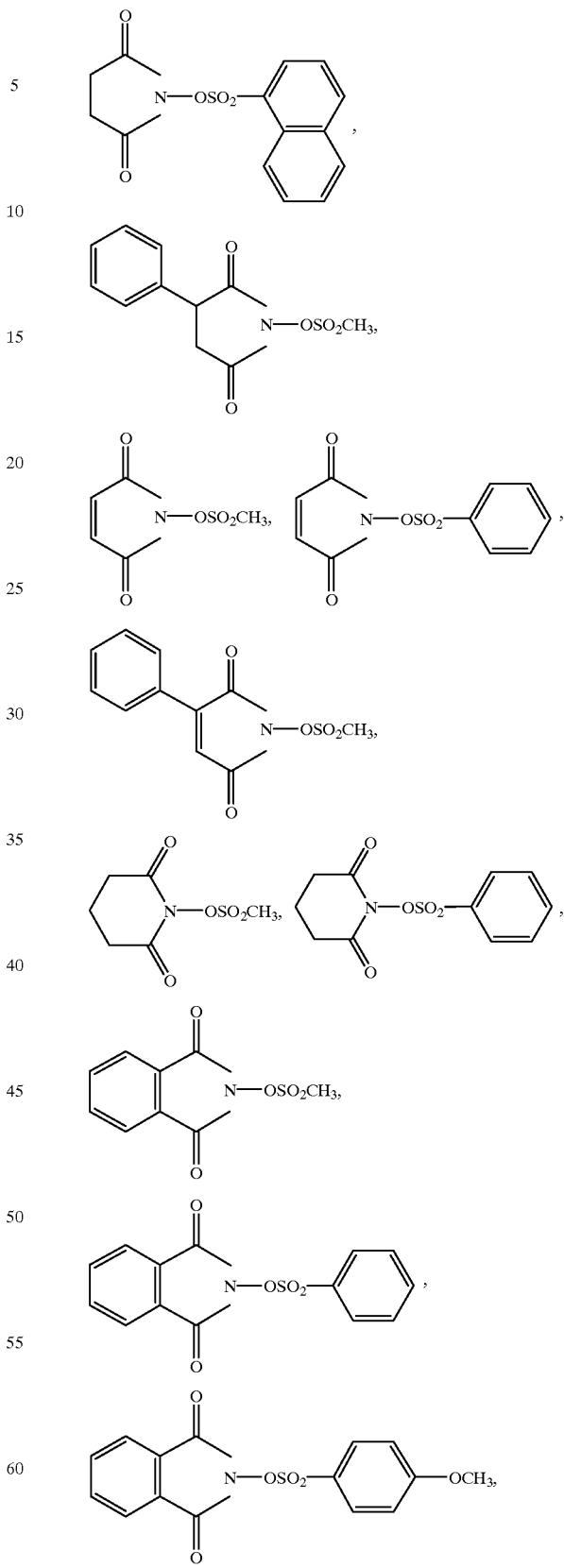

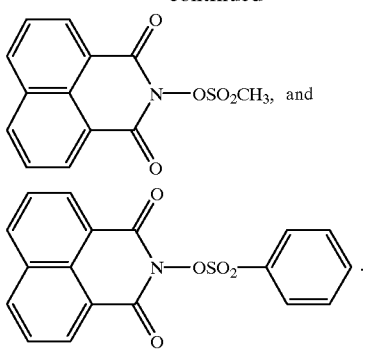

20. The positive photoresist composition according to claim 1, wherein said photo-induced acid precursor is a disulfone compound represented by the following formula (IV);

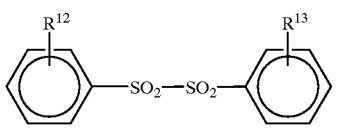
(IV)

wherein $R^{12}$ and $R^{13}$ independently of one another each represents a hydrogen atom, an alkyl group or an alkoxyl group.

21. The positive photoresist composition according to claim 20, wherein said disulfone compound represented by formula (IV) is selected From the group consisting of

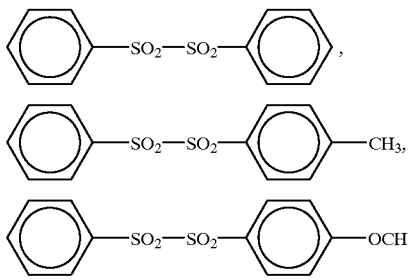

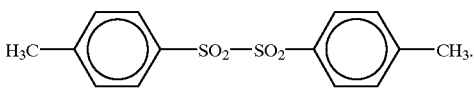

22. The positive photoresist composition according to claim 1, wherein said photo-induced acid precursor is an ester represented by the following formula (V):

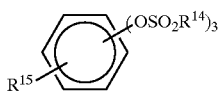
(V)

wherein $R^{14}$ represents an optionally substituted alkyl or aryl group and $R^{15}$ represents a hydrogen atom, an alkyl group, an alkoxyl group or an alkylcarbonyloxy group.

23. The positive photoresist composition according to claim 22, wherein said ester represented by formula (V) is selected from the group consisting of

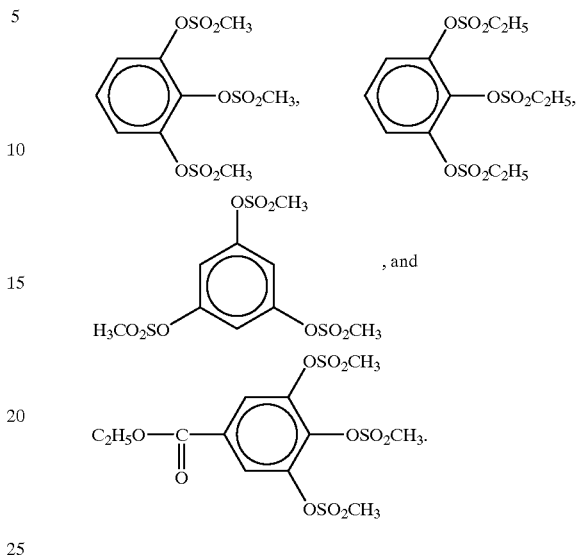

24. The positive photoresist composition according to claim 1, wherein said copolymer has a weight average molecular weight of from 1,000 to 6,000.

25. The positive photoresist composition according to claim 24, wherein said copolymer has a weight average molecular weight of from 2,000 to 5,000.

26. The positive photoresist composition according to claim 1, wherein said dissolution inhibitor represented by formula (II) is

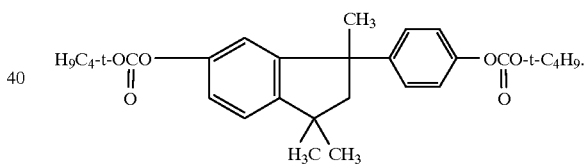

27. The positive photoresist composition according to claim 1, wherein said alkali-soluble resin is present in an amount of from 30 to 90% by weight, said dissolution inhibitor is present in an amount of from 2 to 50% by weight, and said photo-induced acid precursor is present in an amount of from 0.1 to 20% by weight.

28. The positive photoresist composition according to claim 1, wherein said alkali-soluble resin is present in an amount of from 50 to 85% by weight, said dissolution inhibitor is present in an amount of from 12 to 40% by weight, and said photo-induced acid precursor is present in an amount of from 1 to 15% by weight.

29. The positive photoresist composition according to claim 1, further comprising at least one additive selected from the group consisting of a sensitizer, a dye, and an adhesion improver.

* * * * *